United States Patent
Bower et al.

(10) Patent No.: US 11,916,179 B2
(45) Date of Patent: Feb. 27, 2024

(54) STRUCTURES AND METHODS FOR ELECTRICALLY CONNECTING PRINTED HORIZONTAL COMPONENTS

(71) Applicant: X Display Company Technology Limited, Dublin (IE)

(72) Inventors: Christopher Andrew Bower, Raleigh, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 17/703,071

(22) Filed: Mar. 24, 2022

(65) Prior Publication Data

US 2022/0216385 A1 Jul. 7, 2022

Related U.S. Application Data

(63) Continuation of application No. 17/006,674, filed on Aug. 28, 2020, now Pat. No. 11,316,086.
(Continued)

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/08* (2013.01); *H01L 24/32* (2013.01); *H01L 24/83* (2013.01);
(Continued)

(58) Field of Classification Search
CPC ......... H01L 33/62; H01L 24/08; H01L 24/32; H01L 24/83; H01L 25/0753; H01L 33/22;
(Continued)

(56) References Cited

U.S. PATENT DOCUMENTS 4,813,129 A * 3/1989 Karnezos ............. H05K 3/4007
439/74
5,342,207 A 8/1994 Sobhani
(Continued)

FOREIGN PATENT DOCUMENTS

EP 0295914 A2 12/1988

OTHER PUBLICATIONS

Cok, R. S. et al., Inorganic light-emitting diode displays using micro-transfer printing, Journal of the SID, 25(10):589-609, (2017).
(Continued)

*Primary Examiner* — Ismail A Muse
(74) *Attorney, Agent, or Firm* — Choate, Hall & Stewart LLP; Michael D. Schmitt

(57) ABSTRACT

A printed structure comprises a device comprising device electrical contacts disposed on a common side of the device and a substrate non-native to the device comprising substrate electrical contacts disposed on a surface of the substrate. At least one of the substrate electrical contacts has a rounded shape. The device electrical contacts are in physical and electrical contact with corresponding substrate electrical contacts. The substrate electrical contacts can comprise a polymer core coated with a patterned contact electrical conductor on a surface of the polymer core. A method of making polymer cores comprising patterning a polymer on the substrate and reflowing the patterned polymer to form one or more rounded shapes of the polymer and coating and then patterning the one or more rounded shapes with a conductive material.

17 Claims, 19 Drawing Sheets

Related U.S. Application Data

(60) Provisional application No. 63/050,732, filed on Jul. 10, 2020.

(51) Int. Cl.
*H01L 23/00* (2006.01)
*H01L 25/075* (2006.01)
*H01L 33/22* (2010.01)

(52) U.S. Cl.
CPC .......... *H01L 25/0753* (2013.01); *H01L 33/22* (2013.01); *H01L 2224/08238* (2013.01); *H01L 2224/32225* (2013.01); *H01L 2224/80815* (2013.01); *H01L 2224/83862* (2013.01); *H01L 2933/0066* (2013.01)

(58) Field of Classification Search
CPC . H01L 2224/08238; H01L 2224/32225; H01L 2224/80815; H01L 2224/83862; H01L 2933/0066; H05K 2201/09427; H05K 2201/10636; H05K 3/4007; H05K 3/305; H05K 3/368; H05K 2201/0311; H05K 2201/09045; H05K 2201/094; H05K 1/119; H05K 1/111; H05K 1/141; H05K 3/326; H05K 2201/0367; H05K 2201/10484

See application file for complete search history.

(56) References Cited

U.S. PATENT DOCUMENTS

| | | | |
|---|---|---|---|
| 6,249,051 B1 | 6/2001 | Chang et al. | |
| 7,622,367 B1 | 11/2009 | Nuzzo et al. | |
| 7,943,491 B2 | 5/2011 | Nuzzo et al. | |
| 8,506,867 B2 | 8/2013 | Menard | |
| 8,722,458 B2 | 5/2014 | Rogers et al. | |
| 8,889,485 B2 | 11/2014 | Bower | |
| 9,048,407 B2 | 6/2015 | Koyama et al. | |
| 9,331,042 B2 | 5/2016 | Sakurai et al. | |
| 10,097,436 B2 | 10/2018 | King et al. | |
| 10,103,069 B2 | 10/2018 | Bower et al. | |
| 10,153,256 B2 | 12/2018 | Cok et al. | |
| 10,224,460 B2 | 3/2019 | Bower et al. | |
| 10,468,363 B2 | 11/2019 | Prevatte et al. | |
| 10,600,671 B2 | 3/2020 | Bower et al. | |
| 10,784,177 B2 | 9/2020 | Sato | |
| 10,790,173 B2 | 9/2020 | Gomez et al. | |
| 11,101,417 B2 | 8/2021 | Bower et al. | |
| 11,316,086 B2 | 4/2022 | Bower et al. | |
| 2002/0066590 A1 | 6/2002 | Korem | |
| 2002/0070463 A1 | 6/2002 | Chang et al. | |
| 2004/0108133 A1 | 6/2004 | Sano et al. | |
| 2006/0157870 A1 | 7/2006 | Kato et al. | |
| 2006/0258049 A1 | 11/2006 | Lee et al. | |
| 2007/0029671 A1 | 2/2007 | Yamasaki | |
| 2008/0017873 A1* | 1/2008 | Tomoda | H01L 24/11 257/E23.021 |
| 2009/0317969 A1* | 12/2009 | Tanaka | H01L 24/11 257/E21.159 |
| 2010/0295177 A1 | 11/2010 | Ouchi | |
| 2012/0193783 A1 | 8/2012 | Hong et al. | |
| 2012/0313241 A1 | 12/2012 | Bower | |
| 2012/0314388 A1* | 12/2012 | Bower | H05K 3/20 156/219 |
| 2014/0048953 A1* | 2/2014 | Pratt | G03F 9/708 257/797 |
| 2014/0264910 A1 | 9/2014 | Razdan et al. | |
| 2014/0299986 A1 | 10/2014 | Sakurai et al. | |
| 2015/0021759 A1 | 1/2015 | Chen | |
| 2015/0270242 A1 | 9/2015 | Kim et al. | |
| 2016/0093600 A1 | 3/2016 | Bower et al. | |
| 2016/0315040 A1 | 10/2016 | Son et al. | |
| 2017/0229438 A1 | 8/2017 | Razdan et al. | |
| 2017/0243848 A1 | 8/2017 | Nah | |
| 2017/0256522 A1 | 9/2017 | Cok et al. | |
| 2018/0240729 A1* | 8/2018 | Kim | H01L 23/3677 |
| 2018/0277504 A1* | 9/2018 | Bower | H01L 24/75 |
| 2019/0267274 A1 | 8/2019 | Cheng et al. | |
| 2019/0326189 A1* | 10/2019 | Sato | H01L 24/06 |
| 2020/0091034 A1 | 3/2020 | Shao et al. | |
| 2020/0126957 A1* | 4/2020 | Yoo | H01L 24/97 |
| 2020/0214141 A1 | 7/2020 | Bower et al. | |
| 2020/0243467 A1 | 7/2020 | Prevatte et al. | |
| 2021/0043816 A1 | 2/2021 | Bower et al. | |
| 2021/0044078 A1 | 2/2021 | Adachi | |
| 2021/0320077 A1* | 10/2021 | Seo | H01L 24/13 |

OTHER PUBLICATIONS

International Search Report, PCT/EP2021/068067, filed Jun. 30, 2021, 4 pages, (dated Nov. 3, 2021).

Written Opinion, PCT/EP2021/068067, filed Jun. 30, 2021, 7 pages, (dated Nov. 3, 2021).

* cited by examiner

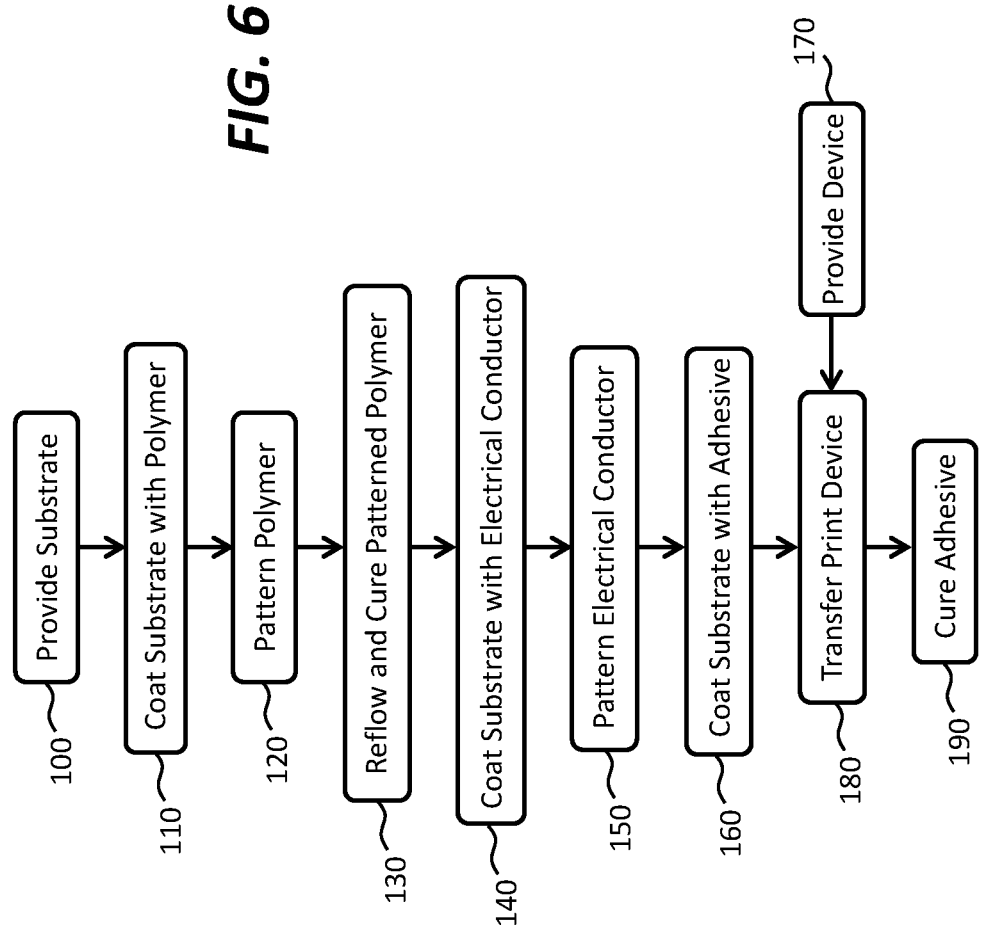

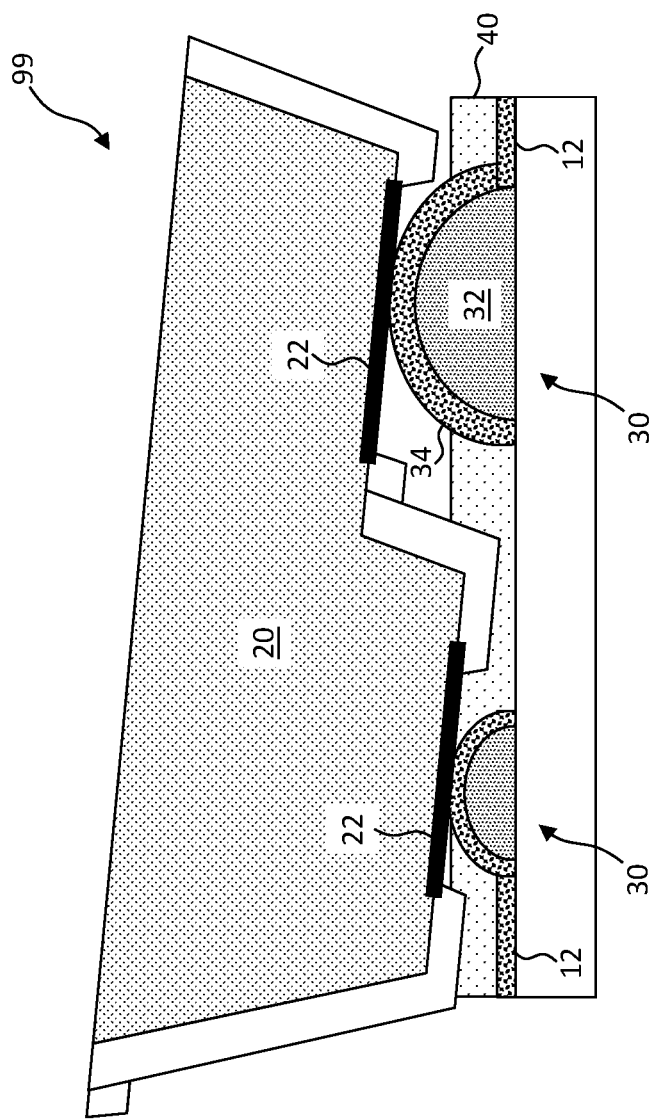

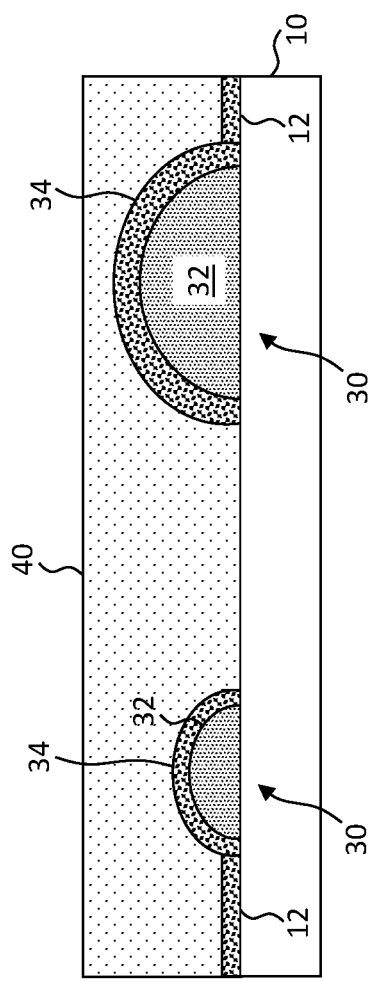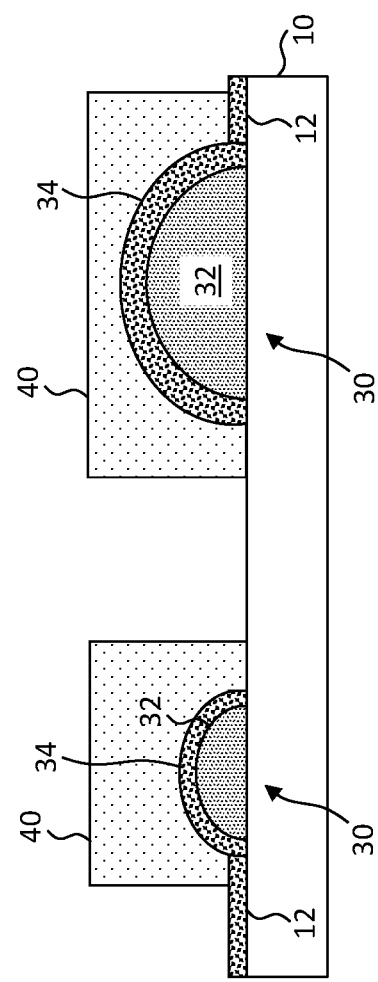

STRUCTURES AND METHODS FOR ELECTRICALLY CONNECTING PRINTED HORIZONTAL COMPONENTS

PRIORITY APPLICATIONS

This application is a continuation of U.S. patent application Ser. No. 17/006,674, filed on Aug. 28, 2020, which claims the benefit of U.S. Provisional Patent Application No. 63/050,732, filed on Jul. 10, 2020, the disclosure of which is incorporated by reference herein in its entirety.

TECHNICAL FIELD

This disclosure relates generally to structures and methods for electrically connecting devices (e.g., printed devices) to destination substrates.

BACKGROUND

Electronic systems typically comprise a substrate, for example a backplane, such as a printed circuit board, on which are assembled electronic components such as integrated circuits, resistors capacitors, inductors, and connectors. The electronic components can be surface mount devices (SMDs) that are typically placed on the backplane together with solder bumps using mechanical pick-and-place equipment and then heated to reflow the solder, thereby adhering the electronic components to the backplane and electrically connecting the electronic components to contact pads or other electrical conductors on the backplane. At present, the smallest surface mount components have dimensions of 600 μm by 300 μm and, for very small and simple electronic devices such as resistors, dimensions of 400 μm by 200 μm. The size of the electrical connection and spacing between contact pads or pins of the electronic devices likewise has a lower limit, for example small solder bumps can have a diameter of 75-150 μm and in extreme cases, solder bumps as small as 30 μm in diameter have been tried. However, there is a demand for increasing electronic system miniaturization with even smaller electronic components and electrical connections.

Methods for transferring active small components, for example components having a size less than the smallest surface mount devices, from one substrate to another are described in U.S. Pat. No. 7,943,491. In examples of these approaches, small integrated circuits are formed on a native semiconductor source wafer. The small unpackaged integrated circuits, or chiplets, are released from the native source wafer by etching a layer formed beneath the circuits. A PDMS stamp is pressed against the native source wafer and the process side of the chiplets is adhered to individual stamp posts. The chiplets are removed from the native source wafer and pressed against a destination substrate or backplane with the stamp to adhere the chiplets to the destination substrate. In other examples, U.S. Pat. No. 8,722,458 teaches transferring light-emitting, light-sensing, or light-collecting semiconductor elements from a wafer substrate to a destination substrate or backplane. The chiplets are then electrically connected using conventional photolithographic methods (e.g., forming patterned metal wires using blanket metal evaporation and photoresist coating, patterned mask exposure, cure, pattern-wise etching, and photoresist stripping). However, these steps can be slow, complex, and relatively expensive for certain applications.

There remains a need, therefore, for disposing small electronic components on a backplane (or other substrates) and electrically connecting the small electronic components to conductors (e.g., contact pads or wires) formed on the backplane.

SUMMARY

The present disclosure provides, inter alia, structures, materials, and methods that provide electrical connections between small electronic components (e.g., having at least one of a length and a width no greater than 200 μm) disposed on a substrate, for example by transfer printing (e.g., microtransfer printing).

According to some embodiments of the present disclosure, a printed structure comprises a device comprising device electrical contacts disposed on a common side of the device and a substrate non-native to the device comprising substrate electrical contacts disposed on a surface of the substrate. At least one of the substrate electrical contacts has a rounded shape. The device electrical contacts are in physical and electrical contact with the corresponding substrate electrical contacts (e.g., each of the device electrical contacts is in contact with a corresponding substrate electrical contact of the substrate electrical contacts). The rounded shape can be at least a portion of a sphere, a portion of a hemisphere, or have one or more side walls with a first curvature and a top with a second curve that has a larger curvature than the first curve, e.g., a flattened top on an opposite side of the rounded shape from the substrate.

According to some embodiments, the device electrical contacts are substantially planar and are disposed in a common plane. According to some embodiments, the device electrical contacts are substantially planar and are disposed in different planes (e.g., each in its own plane). Each of the at least one of the substrate electrical contacts can conform to the shape of a corresponding device electrical contact of the device electrical contacts and a contact electrical conductor on a substrate electrical contact can wick along the device electrical contact.

According to some embodiments of the present disclosure, at least one of the substrate electrical contacts having a rounded shape comprises a polymer core coated with a contact electrical conductor on a surface of the polymer core. The polymer core can be compliant, conformal, flexible, or reflowable. The polymer core can be soft cured, reflowed, and then hard cured. The polymer core can comprise an electrically conductive polymer. The contact electrical conductor can be an electrically conductive surface layer that comprises a metal, a metal alloy, a solder, a transparent conductive oxide, or an electrically conductive polymer. The contact electrical conductor can be reflowable and can wick along another electrically conductive surface. The contact electrical conductor comprising a conductive surface layer can have a thickness no more than 25% of a lateral extent of the polymer core over the surface of the substrate. The conductive surface layer can have a thickness of no more than 250 nm. The contact electrical conductor can be, is, or has been wicked along the device electrical contact. According to some embodiments, each of the at least one of the substrate electrical contacts has a lateral extent over the substrate of no more than 10 μm.

According to some embodiments of the present disclosure, the device comprises one or more active layers through which current flows when current is provided from the substrate electrical contacts through the device electrical contacts. According to some embodiments, the device is tilted with respect to the destination substrate. According to some embodiments, the substrate electrical contacts are at least partially transparent to visible light or light emitted by the device, e.g., at least 50 percent transparent. According to some embodiments, the device is a light-emitting diode, an inorganic light-emitting diode, or an organic light-emitting diode. According to some embodiments, the device has a surface of a second side opposite the common side and the surface of the second side is roughened.

According to some embodiments of the present disclosure, the substrate is an intermediate substrate and the printed structure further comprises a system substrate comprising substrate conductors disposed on or in the system substrate. The device is electrically connected to the substrate conductors through the substrate electrical contacts. Printed structures of the present disclosure can comprise a second device comprising second device electrical contacts disposed on a common side of the second device, wherein the substrate further comprises second substrate electrical contacts disposed on the surface of the substrate and wherein at least one of the second substrate electrical contacts has a rounded shape and each of the second device electrical contacts is in electrical and physical contact with one of the second substrate electrical contacts. The substrate electrical contacts can be electrically connected to one or more substrate conductors disposed in or on the substrate.

According to some embodiments of the present disclosure, the device has at least one of a width, a length, and a thickness of no more than 100 µm, or the device has a length to width ratio of at least 1:1, 2:1, or 4:1, and/or the device has a length and/or width to thickness aspect ratio of at least 1:1, 2:1, 5:1, or 10:1.

According to some embodiments of the present disclosure, printed structures can comprise an adhesive disposed between the device and the substrate that adheres the device to the substrate. The adhesive can have a higher Young's modulus than at least one of the substrate electrical contacts. The adhesive can be cured, soft cured, or hard cured. The adhesive can be or can be in an unpatterned adhesive layer. The adhesive can be a patterned layer. The adhesive can have a thickness less than a thickness of at least one of the substrate electrical contacts such that each of the at least one of the substrate electrical contacts protrudes above the adhesive. At least one of the substrate electrical contacts can have a thickness or height that is greater than a distance between surfaces of ones of the device electrical contacts in a direction orthogonal to at least one of the surfaces. In such embodiments, ones of the device electrical contacts can be disposed in different planes.

According to some embodiments of the present disclosure, all of the substrate electrical contacts have rounded shapes. According to some embodiments of the present disclosure, the at least one of the substrate electrical contacts is a plurality of the substrate electrical contacts and the plurality comprises ones of the substrate contacts having different heights or sizes (e.g., thicknesses). According to some embodiments of the present disclosure, the device is an unpackaged bare die.

According to embodiments of the present disclosure, a method of making electrical connections comprises providing a substrate comprising substrate electrical contacts disposed on a surface of the substrate, wherein at least one of the substrate electrical contacts has a rounded shape, providing a device comprising device electrical contacts disposed on a common side of the device, and printing the device onto the destination substrate such that each of the device electrical contacts is in electrical contact with one of the substrate electrical contacts.

Providing the substrate comprising substrate electrical contacts disposed on a surface of the destination substrate can comprise providing a substrate, patterning a polymer on the substrate, heating (e.g., reflowing) the patterned polymer to form one or more rounded shapes of the polymer, and coating (and optionally patterning) the one or more rounded shapes with a conductive material, wherein each of the at least one of the substrate electrical contacts comprises one of the one or more rounded shapes coated with the conductive material to form a conductive surface layer that is a contact electrical conductor. According to some embodiments, coating the one or more rounded shapes with the conductive material comprises depositing a layer of the conductive material and patterning the layer such that the one or more rounded shapes remain coated with the conductive material.

According to some embodiments, methods of the present disclosure comprise disposing adhesive on the destination substrate prior to printing the device, wherein printing the device comprises contacting the device to the adhesive.

According to some embodiments, methods of the present disclosure comprise curing the adhesive after the device has been printed.

According to some embodiments, methods of the present disclosure comprise baking the device and the destination substrate.

According to some embodiments, methods of the present disclosure comprise reflowing the conductive material.

According to some embodiments, methods of the present disclosure comprise reflowing the rounded shape.

According to some embodiments, methods of the present disclosure comprise conforming the substrate electrical contact to the device electrical contact.

Embodiments of the present disclosure provide methods and structures for electrically connecting small electronic devices to a substrate using efficient and inexpensive manufacturing techniques.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 6-8 are flow diagrams of methods for printing and electrically connecting a device, according to illustrative embodiments of the present disclosure;

FIGS. 9A-9H are successive cross sections illustrating methods of making a printed structure according to illustrative embodiments of the present disclosure;

FIGS. 10A-10D are successive cross sections illustrating methods of adhering a printed device to make a printed structure according to illustrative embodiments of the present disclosure;

Figure 1:
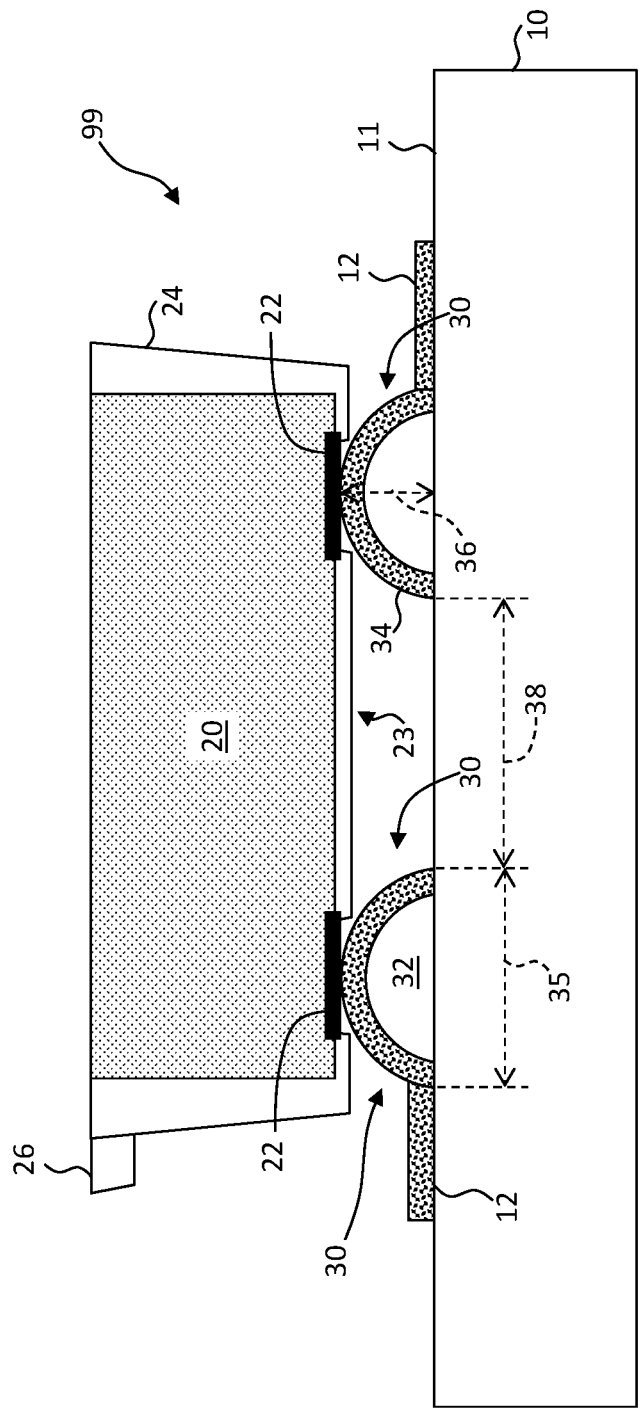
FIG. 1 is a cross section of a device comprising device electrical contacts in a common plane printed onto a substrate with rounded contacts, according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Structures and methods of embodiments of the present disclosure enable electrically connecting printed devices, such as light-emitting devices including inorganic light-emitting diodes, to substrate electrical contacts disposed on a substrate. Each device likewise comprises a device electrical contact. One or more substrate electrical contacts can comprise a heat-reflowable material (such as a polymer, resin, epoxy, or soft metal, for example) disposed on and protruding from a surface of a substrate and coated with a surface conductive layer and patterned to form a contact electrical conductor. Substrate electrical contacts can have a rounded shape (e.g., can be bumps, can be hemispherical, can have other rounded shapes, or can have contact angles less than 180 degrees) and can be formed by heating (e.g., reflowing) a patterned layer of polymer so that surface energy (surface tension or capillary) forces form rounded shapes at a high resolution to which devices can be printed and electrically connected without using photolithographic methods to form electrical connections between the device and the substrate. In particular, according to some embodiments of the present disclosure, photolithographic processing to form electrical connections between a substrate and a printed device can be unnecessary (reducing photolithographic processing steps) and problems with forming electrical connections over the device edge (e.g., a step height) are avoided.

The patterned electrical conductor coating (the contact electrical conductor) can also be heat reflowable (e.g., comprise a solder). A device can be printed to a substrate (e.g., using an elastomeric stamp to micro-transfer print the device, for example as described in U.S. patent application Ser. No. 16/532,591, filed Aug. 6, 2019, the disclosure of which is hereby incorporated by reference herein in its entirety) with each device electrical contact in electrical (e.g., and physical) contact with a corresponding substrate (e.g., and physical) electrical contact. After the device is printed, substrate electrical contacts can be heated, for example by heating the substrate. The heat can cause the heat-reflowable material to flow, which can cause substrate electrical contact(s) to conform with the shape of the device electrical contact(s) and the contact electrical conductor to wick along the device electrical contact(s) to improve electrical contact by increasing the contact area between the device electrical contact and the substrate electrical contact and to firmly adhere the device to the substrate. Thus, in some embodiments, a substrate electrical contact is conformable and conforms to a device electrical contact. In some embodiments, the substrate electrical contact can be cured after conforming to the device electrical contact. A substrate electrical contact can be compliant. The printed structure can then be cooled, for example to room temperature, integrated into an electrical system, and operated.

As shown in FIG. 1, a printed structure 99 comprises a device 20 comprising device electrical contacts 22 disposed on a common side 23 of device 20 and a substrate 10 non-native to device 20 comprising substrate electrical contacts 30 disposed on a surface 11 of substrate 10. At least one of substrate electrical contacts 30 has a rounded shape. Common side 23 of device 20 can be adjacent to surface 11 so that device electrical contacts 22 face substrate electrical contacts 30. Device electrical contacts 22 are in physical and electrical contact with corresponding substrate electrical contacts 30. Device 20 can be any functional device, for example an electrical or optical device such as an integrated circuit and can comprise active components (e.g., transistors, diodes, inorganic light-emitting diodes, organic light-emitting diodes, or sensors) and passive components (e.g., electrical conductors such as wires, optical conductors such as light pipes, electrical resistors, electrical capacitors, and electrical inductors). Device 20 can be electrically insulated by patterned dielectric structure 24 that exposes device electrical contacts 22. Device 20 can comprise one or more active layers (e.g., semiconductor layers, for example forming one or more quantum wells) through which electrical current flows when electrical current is provided by device electrical contacts 22. Device 20 can comprise one or more of a device substrate (e.g., a dielectric substrate or a semiconductor substrate), patterned dielectric structures 24, and semiconductor structures or layers (e.g., silicon or compound semiconductors). Device 20 can comprise a semiconductor component disposed on a dielectric device substrate or a semiconductor layer of device 20 can comprise a device substrate. Device 20 can comprise multiple components, such as optical or electrical components or a combination of one or more optical and one or more electrical components (e.g., an LED and a controller). Device 20 can be or comprise one or more of one or more inorganic or organic light-emitting diodes, one or more control circuits, and one or more electrical conductors. Device 20 can comprise a silicon device substrate with a control circuit disposed in or on the silicon device substrate and light-emitting diodes or other compound semiconductor devices disposed on the silicon device substrate, for example by micro-transfer printing, that can be controlled by the control circuit. In some embodiments, a control circuit is disposed on a dielectric device substrate, for example by micro-transfer printing.

Embodiments of the present disclosure can be applied to high-resolution and dense micro-circuits with small devices 20. According to some embodiments, device 20 is a micro-device and has at least one of a length and a width no greater than 200 µm (e.g., no greater than 100 µm, no greater than 50 µm, no greater than 20 µm, no greater than 10 µm, or no greater than 5 µm). Device 20 can have various aspect ratios, for example (i) a length to width and/or (ii) a length and/or width to thickness aspect ratio of at least 1:1, at least 2:1, at least 4:1, at least 8:1, or at least 10:1.

Device 20 can be a flip chip, with active components provided on common side 23 and disposed in an inverted configuration with respect to substrate 10. In some embodiments, device 20 comprises active components provided on a side of device 20 opposite common side 23. Active components can be connected to device electrical contacts 22 using, for example vias such as through-silicon vias (TSVs). Active components in device 20 can be formed in or on a surface of a semiconductor device substrate or disposed on a semiconductor or dielectric device substrate. Components can be disposed on device 20 substrate by micro-transfer printing and can comprise fractured or separated component tethers as a consequence of transfer printing (not shown). Moreover, devices 20 can be micro-transfer printed onto substrate 10, for example using elastomeric stamps, and can comprise a fractured or separated device tether 26 as a consequence of transfer printing.

Device 20 can have two or more device electrical contacts 22. The two or more device electrical contacts 22 can be substantially planar and can be disposed in a common plane on common side 23, for example as shown in FIG. 1, and can be electrically connected to components in device 20. Device electrical contacts 22 can comprise a patterned metal contact pad or patterned transparent conductive oxide contact pad. Device 20, device electrical contacts 22, and dielectric structures 24 can be constructed using photolithographic methods and materials, for example as found in the integrated circuit and display industries.

Device electrical contacts 22 and substrate conductors 12 (e.g., wires) can comprise metals such as aluminum, gold, or silver or combinations (e.g., alloys) thereof and can be deposited, for example by evaporation or sputtering, and, in some embodiments, patterned using pattern-wise exposed, cured, and etched photoresists, e.g., constructed using photolithographic methods and materials, imprinting methods and materials, or inkjet printers and materials, for example comprising cured conductive inks deposited on a surface or provided in micro-channels.

Substrate 10 can be any suitable substrate, for example comprising any one or more of glass, polymer, ceramic, sapphire, quartz, or a semiconductor, having surface 11 suitable for forming substrate electrical contacts 30 and contacting device 20, for example a substantially planar surface (excluding rounded substrate electrical contacts 30) within the limitations of a manufacturing process. Substrate 10 can be a backplane, a pixel substrate, a display substrate, or a printed circuit board. Substrate 10 can be patterned with substrate conductors 12, such as wires or traces, that for example, may be electrically connected and disposed to be used to conduct electrical current, ground, or electrical control signals. Conductors 12 can be disposed in or on substrate 10. Substrate 10 can be constructed using methods and materials known in the integrated circuit and display industries.

Substrate electrical contact 30 can have a rounded shape that is at least a portion of a sphere, ellipsoid, teardrop, or hemisphere, a solid with an oval or elliptical cross section, that has no sharp angles or corners, or that has one or more side walls with a first curvature and a top with a second curve that has a larger curvature than the first curvature (e.g., a flattened sphere with a flat or flatter portion disposed on the top of substrate electrical contact 30). When substrate electrical contact 30 has a rounded shape, substrate electrical contact 30 is proud of (e.g., is above, protrudes from, or extends from) substrate 10 and can have a contact angle with respect to substrate 10 that is no greater than 180 degrees. According to some embodiments, at least one of substrate electrical contacts 30 conforms to the shape of a corresponding device electrical contact 22. For example, a flat portion of substrate electrical contact 30 can conform to and follow the contours of a portion of a substantially planar device electrical contact 22.

According to some embodiments of the present disclosure, and as shown in FIG. 1, at least one of the rounded substrate electrical contacts 30 comprises a polymer core 32 coated with a patterned conductive surface layer forming a contact electrical conductor 34. Polymer core 32 can be rigid or can be compliant, conformal, flexible, or reflowable. For example, polymer core 32 can be a partially cured, compliant polymer (or a softened polymer, such as one at a temperature above its glass transition temperature) that is placed into contact with device 20 and device electrical contacts 22 to conform substrate electrical contacts 30 to device electrical contacts 22 and then subsequently hard-cured to form a rigid polymer core 32 that conforms to device electrical contact 22. Polymer core 32 can comprise an electrically conductive polymer (e.g., polythiophene or other electrically conductive polymers) and can conduct electrical current. Polymer core 32 can be photoactive and patternable using photolithographic methods and materials. Polymer core 32 can be a thermoplastic material or a thermoset material.

Contact electrical conductor 34 comprises a conductive material that can be coated on a non-conductive core. For example, contact electrical conductor 34 can be a surface layer film comprising a thin film of physically deposited metal or conductive oxide, or a combination of these. An electrical conductor can be coated (e.g., deposited) and patterned such that the outer surface of each polymer core 32 is separately electrically conductive. Contact electrical conductor 34 can be in electrical and physical contact with device electrical contact 22. Contact electrical conductor 34 (or device electrical conductor 22, or both) can comprise a metal, a metal alloy, a solder, a transparent conductive oxide (e.g., indium tin oxide or aluminum zinc oxide), or an electrically conductive polymer. According to some embodiments, contact electrical conductor 34 is transparent, polymer core 32 is transparent, and substrate electrical contact 30 is transparent (or device electrical conductor 22, or both), for example 50% transparent to visible light or light emitted from device 20 (e.g., not less than 70% transparent, not less than 80% transparent, or not less than 90% transparent to visible light or light emitted from device 20). Contact electrical conductor 34 can be reflowable and, in some embodiments, can wick along device electrical contact 22 by heating once device 20 has been printed to substrate 10. For example, heat can be applied to cure polymer core 32 and contact electrical conductor 34 that causes polymer core 32 to reflow (e.g., soften and morphologically equilibrate) such that it conforms to device 20 and device electrical contact 22. In some embodiments, heating can alternatively or additionally cause contact electrical conductor 34 to reflow and wick along the surface of device electrical contact 22, thereby improving and strengthening the physical and electrical contact between substrate electrical contact 30 and device electrical contact 22 and between substrate 10 and device 20. By reflowing a conductive surface layer of substrate electrical contact(s) 30, contact with device electrical contacts 22 can be improved, especially for device electrical contacts 22 in different planes where contact area between substrate electrical contacts 30 and device electrical contacts 22 can be small initially (e.g., after printing prior to heating). Contact electrical conductor 34 can be a surface layer. As an example, in some embodiments, contact electrical conductors 34 have a thickness no more than 25% of a lateral extent of polymer core 32 over surface 11 of substrate 10. As another example, contact electrical conductors 34 can have a thickness of no more than one μm (e.g., no more than 500 nm, no more than 250 nm, or no more than 100 nm).

According to embodiments of the present disclosure, printed structure 99 can provide devices 20 electrically connected to substrate conductors 12 in a dense configuration and at a high resolution over substrate 10, for example by micro-transfer printing devices 20 using a stamp that has at least hundreds, at least thousands, at least tens of thousands, or at least hundreds of thousands of posts that each pick up a respective device 20 from a source wafer. Substrate conductors 12 can be wires and can be deposited and patterned in a common step with contact electrical conductors 34. If substrate 10 is a backplane, contact electrical conductors 34 can be electrically connected to backplane wiring levels through a via using traditional routing techniques.

According to some embodiments, substrate electrical contacts 30 have a lateral extent (e.g., diameter 35) over substrate 10 of no more than 50 μm, no more than 20 μm, no more than 10 μm, or no more than 5 μm. Furthermore, substrate electrical contacts 30 can be disposed close to each other at a high resolution, for example separated by separation distance 38 of no more than 50 μm, no more than 20 μm, no more than 10 μm, or no more than 5 μm. Substrate electrical contacts 30 can protrude orthogonally from surface 11 of substrate 10 to a similar distance of height 36 (e.g., have similar thicknesses), for example to a height 36 of (e.g., have a thickness of) no more than 50 μm, no more than 20 μm, no more than 10 μm, or no more than 5 μm. For example, height 36 can be 0.5 to 5 μm or 1-2 μm, diameter 35 can be 2 to 10 μm or 3-5 μm, planar electrical contacts can be 5-10 μm wide and/or long, and device 20 can have a length and/or width of 2-20 μm, for example 3-5 μm.

Figure 2:
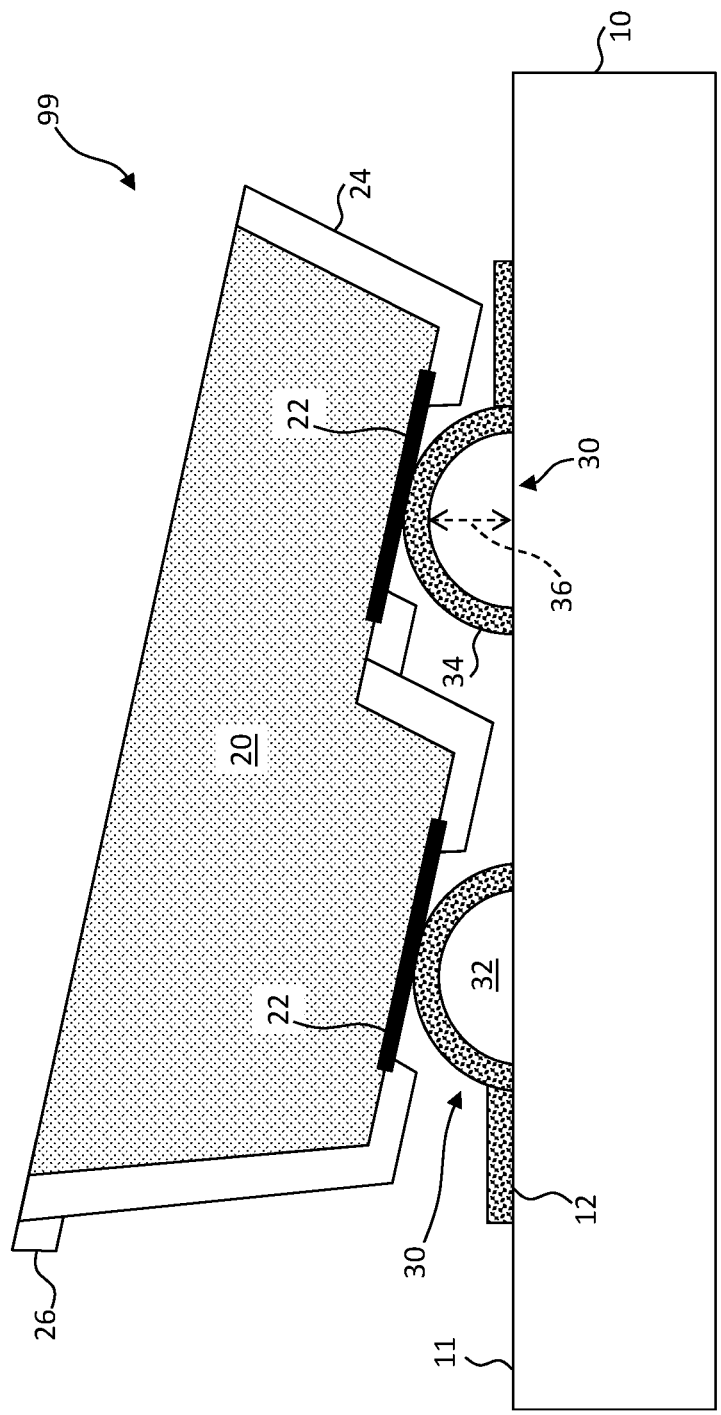
FIG. 2 is a cross section of a tilted horizontal LED comprising device electrical contacts in different planes printed onto a substrate with rounded contacts, according to illustrative embodiments of the present disclosure.
Figure 3:
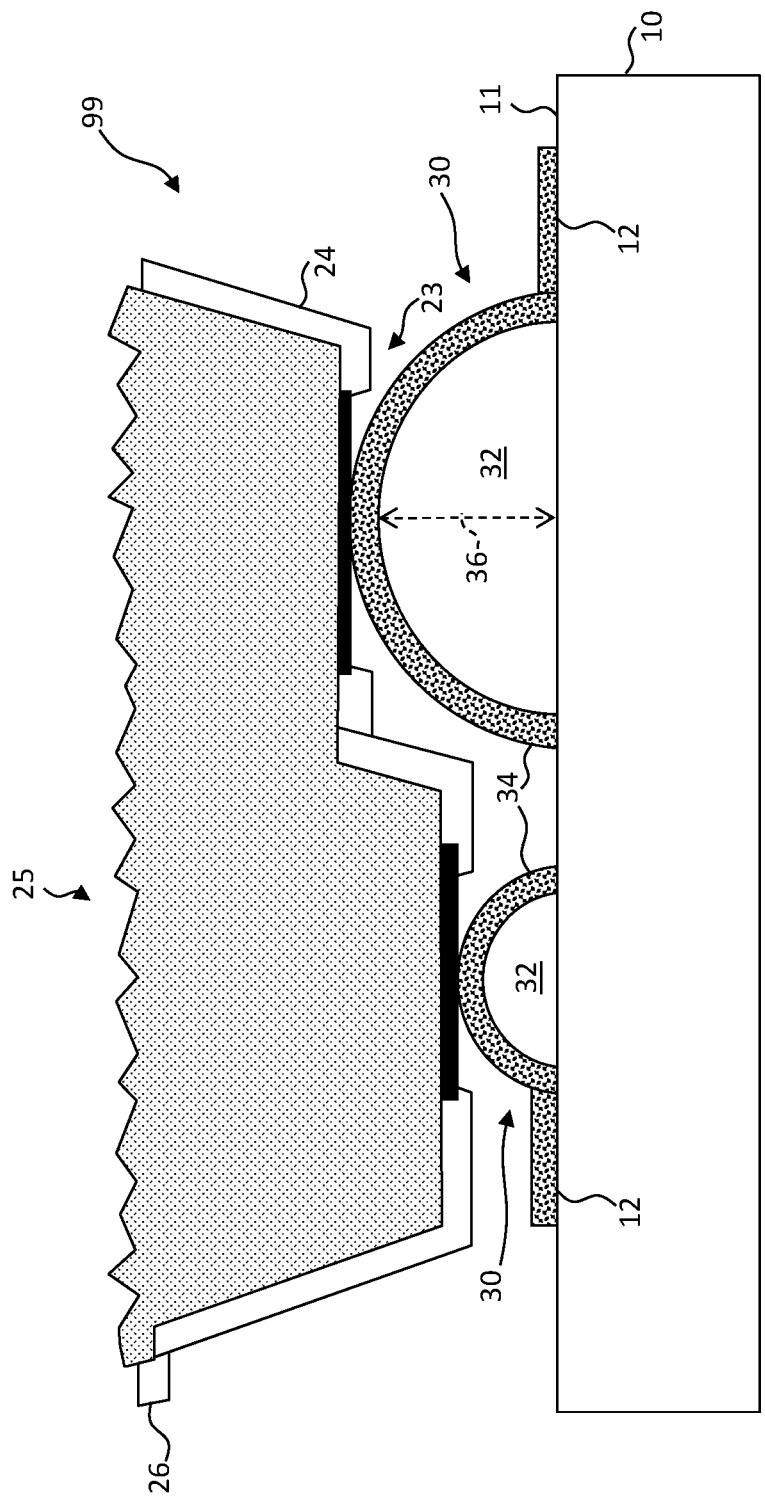
FIG. 3 is a cross section of a horizontal LED with a roughened surface and comprising device electrical contacts in different planes printed onto a substrate with rounded contacts of different sizes, according to illustrative embodiments of the present disclosure.

FIG. 1 illustrates a device 20 with substantially planar device electrical contacts 22 disposed substantially in a common plane. According to embodiments of the present disclosure, and as shown in FIG. 2, device 20 can comprise a device 20 comprising substantially planar device electrical contacts 22 disposed on common side 23 of device 20 but in different planes. The different planes can be, but are not necessarily, substantially parallel (e.g., to within 10 degrees). A device 20 having multiple device electrical contacts 22 on a common side 23 is a horizontal device. For example, device 20 can be a horizontal inorganic light-emitting diode. In embodiments in which substrate electrical contacts 30 have a common height 36 and device electrical contacts 22 are in different planes, device 20 disposed on substrate 10 can be tilted with respect to surface 11 of substrate 10, for example as shown in FIG. 2. A tilted arrangement can be one in which a major surface of device 20 is not substantially parallel to surface 11, for example a surface of device 20 on an opposite side of device 20 from device electrical contacts 22 or substrate 10. As shown in FIG. 3, and according to some embodiments of the present disclosure, substrate electrical contacts 30 on a substrate 10 can have different sizes, for example different lateral extents over (e.g., diameters 35) or different heights 36 above surface 11 of substrate 10. In some such embodiments, devices 20 with device electrical contacts 22 in different planes can have a major surface that is parallel to surface 11, as also shown in FIG. 3.

According to some embodiments of the present disclosure and as shown in FIG. 3, device 20 is or comprises a light-emitting diode and a surface of device 20, e.g., a second side 25 surface opposite common side 23 and a surface of second side 25 is roughened. Roughening can be accomplished, for example, by exposure to a plasma such as an oxygen plasma and the roughened surface can at least partially mitigate or eliminate total internal reflection of light emitted by active layers in the light-emitting diode, thereby improving the efficiency, appearance, and angular distribution of light emission from the light-emitting diode, for example to widen the angle of view for emitted light, as illustrated in FIG. 3, or compensate for a tilted light-emitting diode, as illustrated in FIG. 2.

Furthermore, for light-emitting devices, a roughened second side 25 opposite device electrical contacts 22 provides a diffuse light output that is not dependent on the orientation angle of device 20 with respect to the substrate 10.

Figure 4:
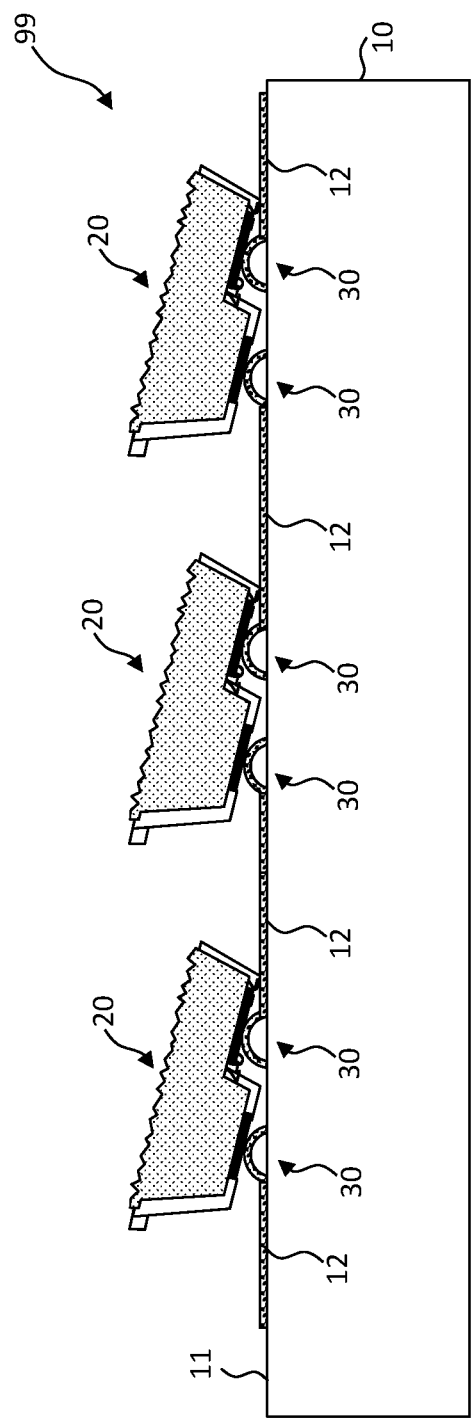
FIG. 4 is a cross section of multiple horizontal LEDs with roughened surfaces printed onto a substrate in contact with two rounded contacts where the devices are tilted, according to illustrative embodiments of the present disclosure.

As shown in FIG. 4. and according to embodiments of the present disclosure, multiple devices 20 can be disposed on and in physical and electrical contact with multiple corresponding substrate electrical contacts 30 on a substrate 10. Devices 20 can be arranged randomly over substrate 10, in an unstructured arrangement over substrate 10 or in a structured arrangement over substrate 10 (e.g., in an array over substrate 10). Some devices 20 can be electrically connected together through substrate electrical conductors 30, for example by substrate conductors 12. The arrangement of devices 20 can form a display or detector (or a combination display and detector).

Figure 5A:
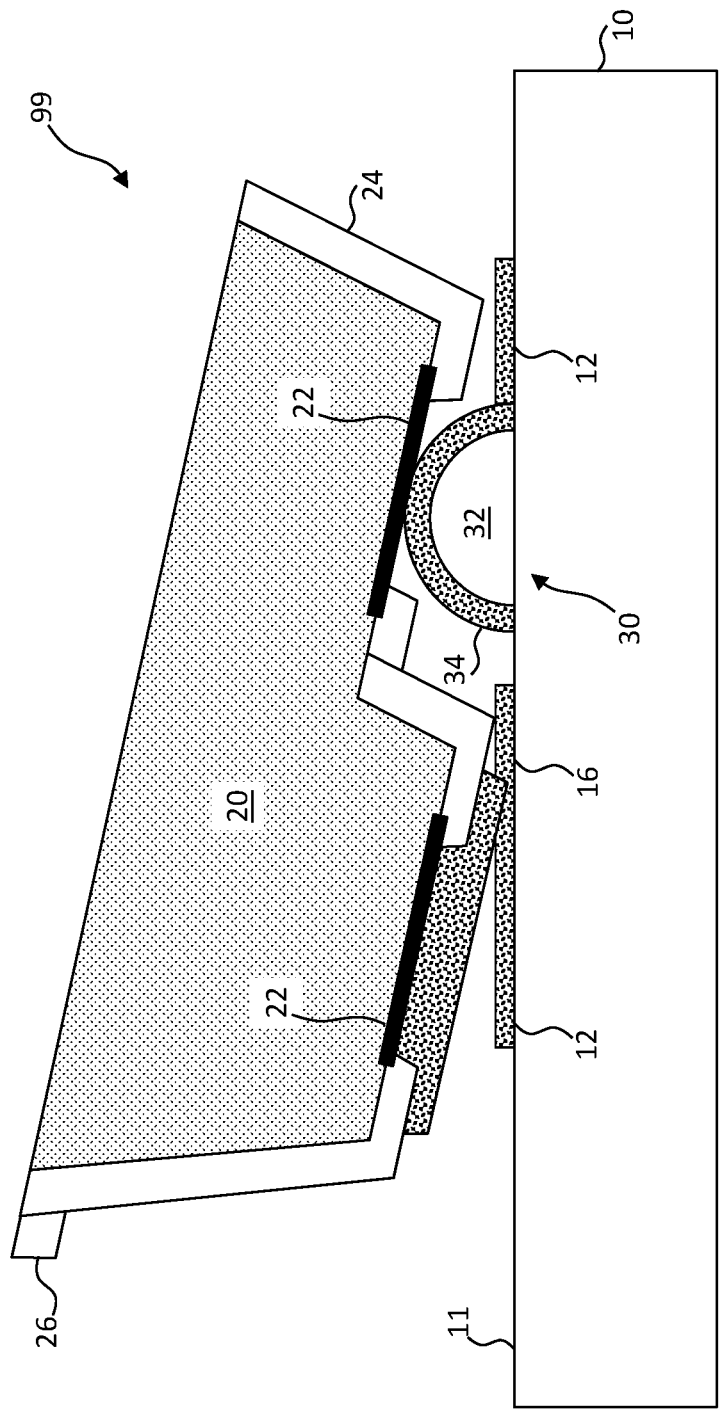
FIGS. 5A and 5B are each a cross section of an LED printed onto a substrate in contact with one rounded contact and one planar contact, according to illustrative embodiments of the present disclosure.
Figure 5B:
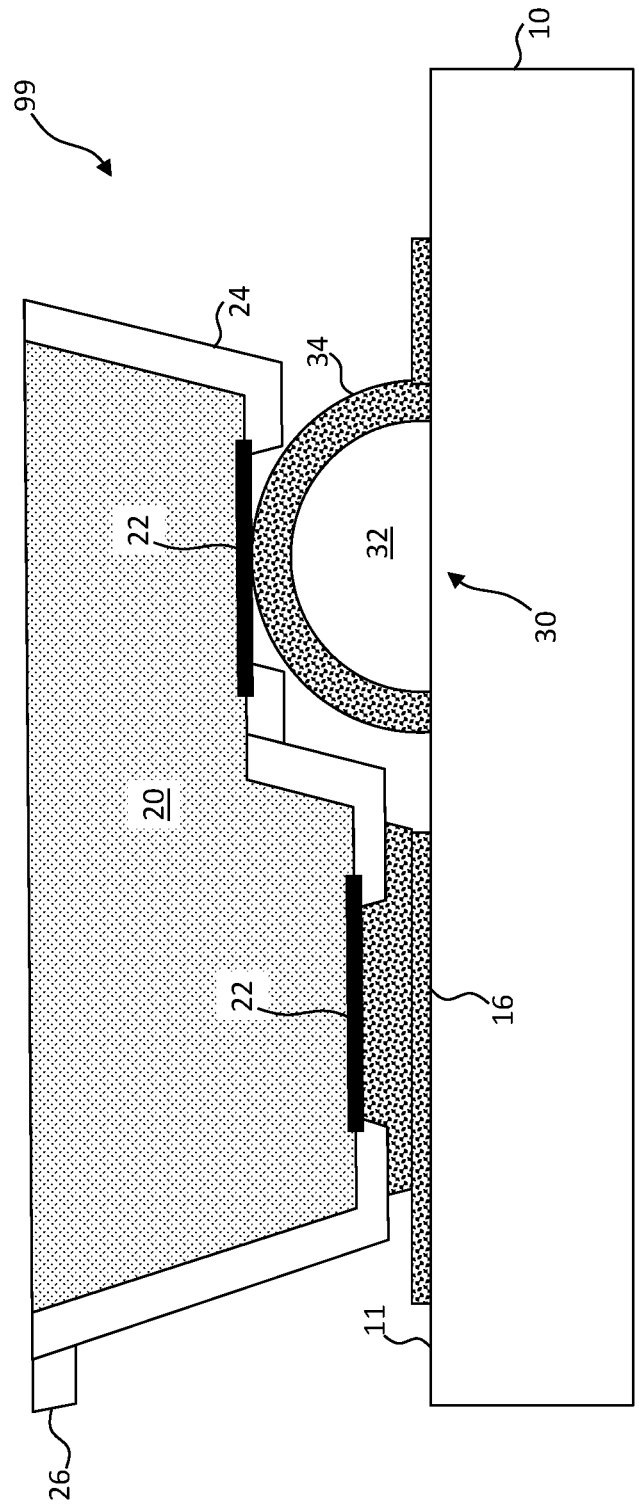

According to some embodiments, and as shown in FIG. 4, substrate 10 can have a rounded substrate electrical contact 30 provided for each device electrical contact 22. In some embodiments, and as shown in FIGS. 5A and 5B, a substrate 10 comprises a planar electrical contact 16 and a device electrical contact 22 is in electrical (e.g., physical) contact with planar electrical contact 16. As shown in FIGS. 5A and 5B, devices 20 have multiple device electrical contacts 22 and less than all of the device electrical contacts 22 are electrically connected to substrate conductors 12 through rounded substrate electrical contacts 30. As shown, some device electrical contacts 22 can be electrically connected to substrate conductors 12 through substantially planar electrical contacts 16 (electrical contact pads on substrate 10) that can be electrically connected to substrate conductors 12. Devices 20 can be tilted, as shown in FIG. 5A or can be flat (not tilted), as shown in FIG. 5B, for example if substrate electrical contact 30 has a height 36 substantially equal to the orthogonal difference between the different device electrical contact 22 planes.

Figure 9A:
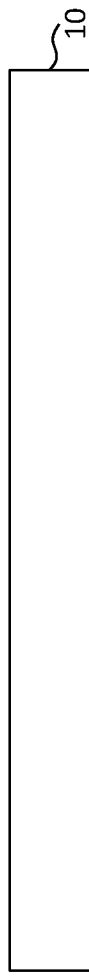
Figure 9B:
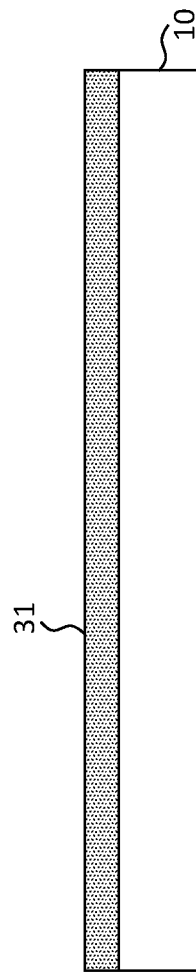
Figure 9C:
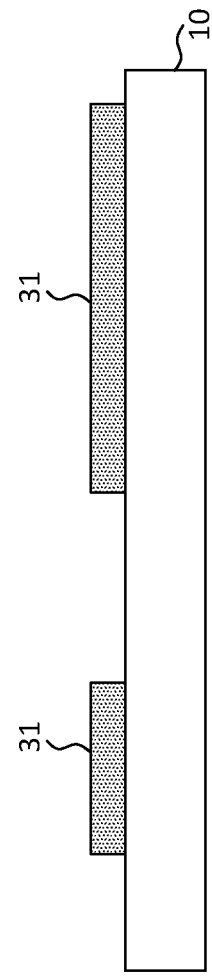
Figure 9D:
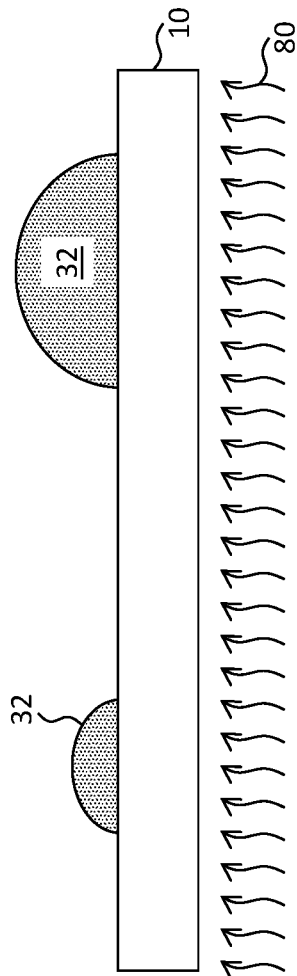
Figure 9E:
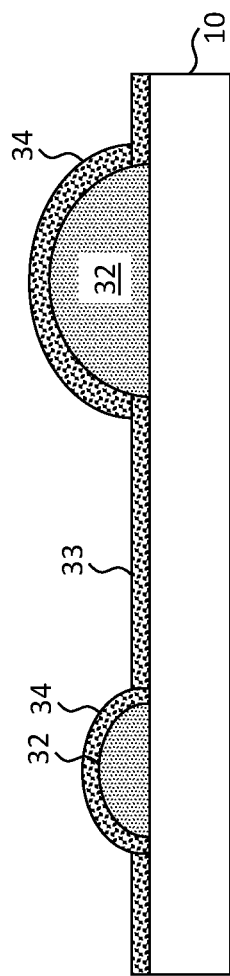
Figure 9F:
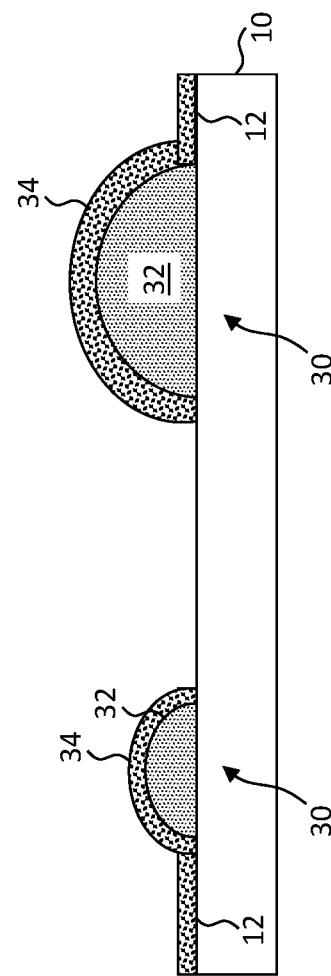
Figure 9G:
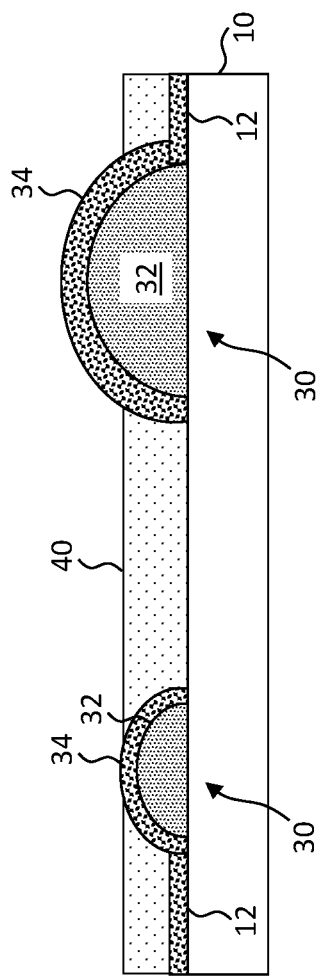

As shown in the flow diagram of FIG. 6 and with reference to the successive structures illustrated in FIGS. 9A-9H, embodiments of the present disclosure can be constructed by providing a substrate 10 in step 100, as shown in FIG. 9A. As shown in FIG. 9B, substrate 10 is coated with a polymer 31 (e.g., an unpatterned reflowable layer of polymer 31 disposed by slot coating, spin coating, or spray coating) in step 110. Polymer 31 can optionally be partially cured (e.g., soft cured) and can be patterned in step 120 as shown in FIG. 9C, for example by coating with a photomask, exposing the photomask with a pattern, etching masked or unmasked portions of polymer 31 to form a patterned layer of polymer 31, and stripping the photomask, as is known in photolithography. In step 130 and as shown in FIG. 9D, patterned polymer 31 can be heated with heat 80 to reflow polymer 31. Because of the relative surface energies of polymer 31 and surface 11 of substrate 10, reflowing polymer 31 can form droplets (beads) on surface 11 to form polymer cores 32 in a rounded shape. Polymer cores 32 can then be hard cured or a hard cure can be performed later. Polymer 31 can comprise, for example, a thermoplastic material. Optionally, substrate 10 can be initially coated with a material selected to provide a suitable surface energy and enhance or enable the formation of rounded polymer cores 32. Substrate 10 and polymer cores 32 can then be coated with an electrical conductor coating 33 as shown in FIG. 9E (e.g., by evaporation, sputtering, or vapor deposition) in step 140 and patterned in step 150, as shown in FIG. 9F, to form contact electrical conductor 34 and substrate conductors 12 (and any planar electrical contacts 16 shown in FIGS. 5A and 5B). Surface 11 of substrate 10 is then coated with adhesive 40 in step 160 as shown in FIG. 9G. Substrate electrical contact 30 can have or be treated to have a surface energy selected to reduce the amount of adhesive 40 that coats substrate electrical contact 30. Devices 20 with device electrical contacts 22 are provided in step 170 and disposed (e.g., micro-transfer printed) onto substrate electrical contacts 30 in step 180 and as shown in FIG. 9H. Adhesive 40 is cured in step 190 to form printed structure 99. The resulting printed structure 99 comprises a mass-transferred device 20 that is mechanically attached to substrate 10 through the cured polymer resin adhesive 40, like a die attach, and the same device 20 is electrically connected to the underlying backplane (substrate 10) through the physical bond between the underside device electrical conductor 22 (device contact pad) and the substrate electrical conductor 30 (substrate contact electrical conductor 34 or substrate contact pad disposed on the top-side conductive surface layer of polymer core 32 in a rounded configuration such as a bump).

Figure 7:
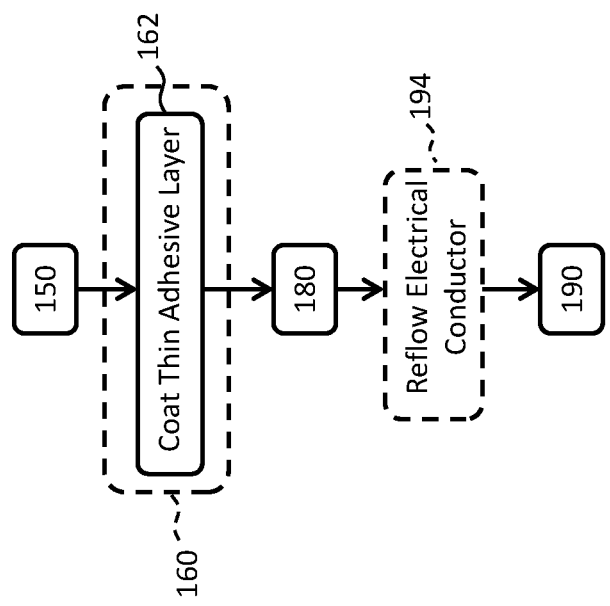

In some embodiments, device electrical contacts 22 are brought into physical and electrical contact with contact electrical conductors 34 by micro-transfer printing, for example as shown in FIG. 9H. In some embodiments, adhesive 40 can be disposed between device electrical contacts 22 and contact electrical conductors 34. In either case, curing adhesive 40 shrinks adhesive 40 and pulls device 20 toward substrate 10 so that device electrical contacts 22 are brought more closely into physical and electrical contact with contact electrical conductor 34 and substrate electrical contacts 30. Polymer core 32 of substrate electrical contacts 30 can have a lower Young's modulus than adhesive 40. According to some methods of the present disclosure, and as illustrated in the flow diagram of FIG. 7 and in FIG. 9G, a relatively thin layer of adhesive 40 is disposed over substrate 10 in step 162 that has a depth less than height 36 of substrate electrical contacts 30. When devices 20 are transfer printed (e.g., micro-transfer printed with an elastomeric stamp) in step 180, a portion of devices 20 contacts adhesive 40 and, when adhesive 40 is cured and shrinks in step 190, devices 20 are brought into closer proximity to substrate 10 and device electrical contacts 22 are brought into closer proximity and electrical contact with substrate electrical contacts 30. Optionally, contact electrical conductor 34 of substrate electrical contacts 30 reflows to wick onto device electrical contact 22 to improve electrical contact with device electrical contact 22 when heated (e.g., during an adhesive curing step). In some embodiments, device electrical contact 22 comprises reflowable material, such as a solder that wicks onto contact electrical conductor 34 (or both). In some embodiments, reflowing a conductor (whether from device electrical contact 22 or substrate electrical contact 30) can occur as a part of curing adhesive 40. Similarly, in some embodiments, polymer core 32 can reflow and conform to or comply with device electrical contact 22 as a part of curing adhesive 40.

According to some methods of the present disclosure, and as shown in FIG. 10A, a relatively thick layer of adhesive 40 is disposed over substrate 10 that has a depth greater than height 36 of substrate electrical contacts 30. If devices 20 are transfer printed (e.g., micro-transfer printed with an elastomeric stamp) in step 180 onto such a thick adhesive 40 layer, devices 20 can be disposed on (e.g., float on) adhesive 40 (although in some embodiments adhesive 40 is pushed aside and device electrical contacts 22 are disposed in contact with substrate electrical contacts 30). In some embodiments, curing adhesive 40 can bring device electrical contacts 22 into physical and electrical contact with substrate electrical contacts 30, as described above with respect to FIG. 7. Adhesive 40 is then cured in step 190.

Figure 8:
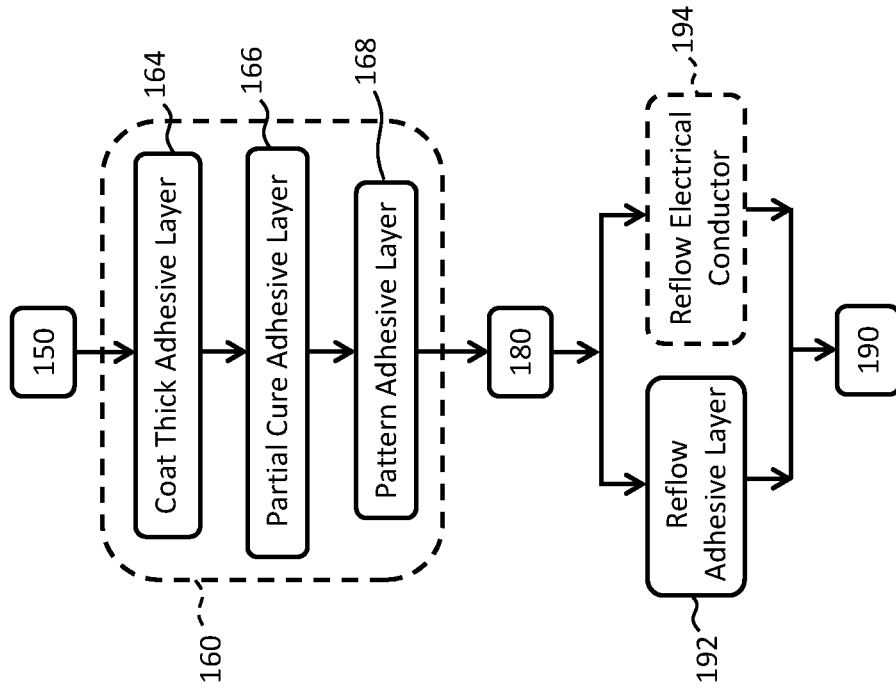
Figure 10C:
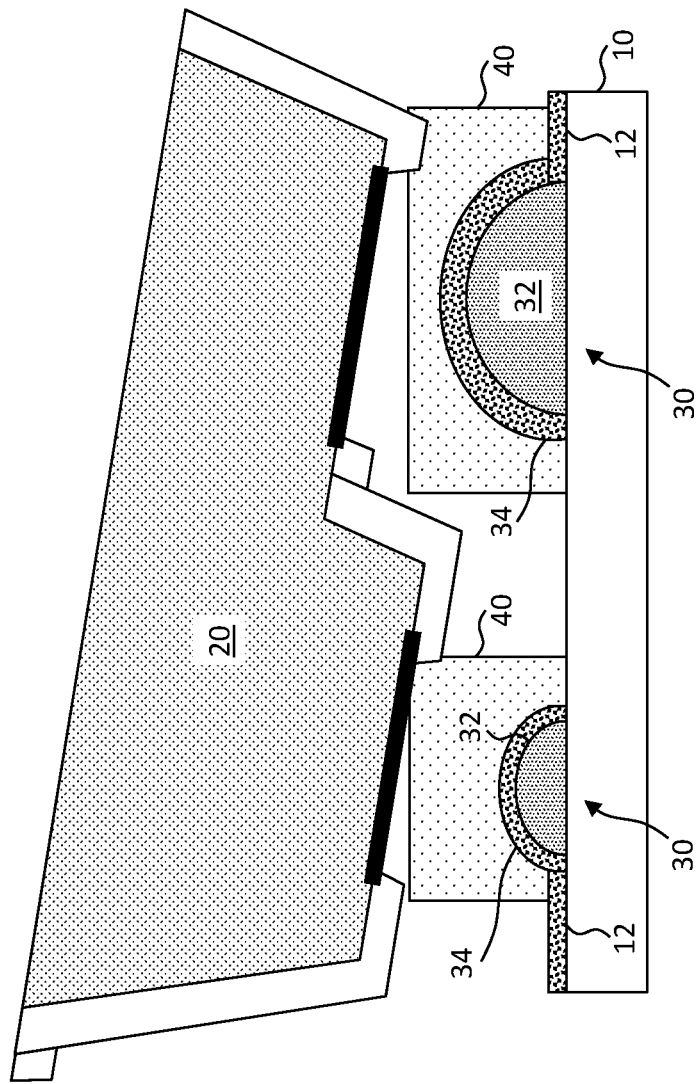
Figure 10D:
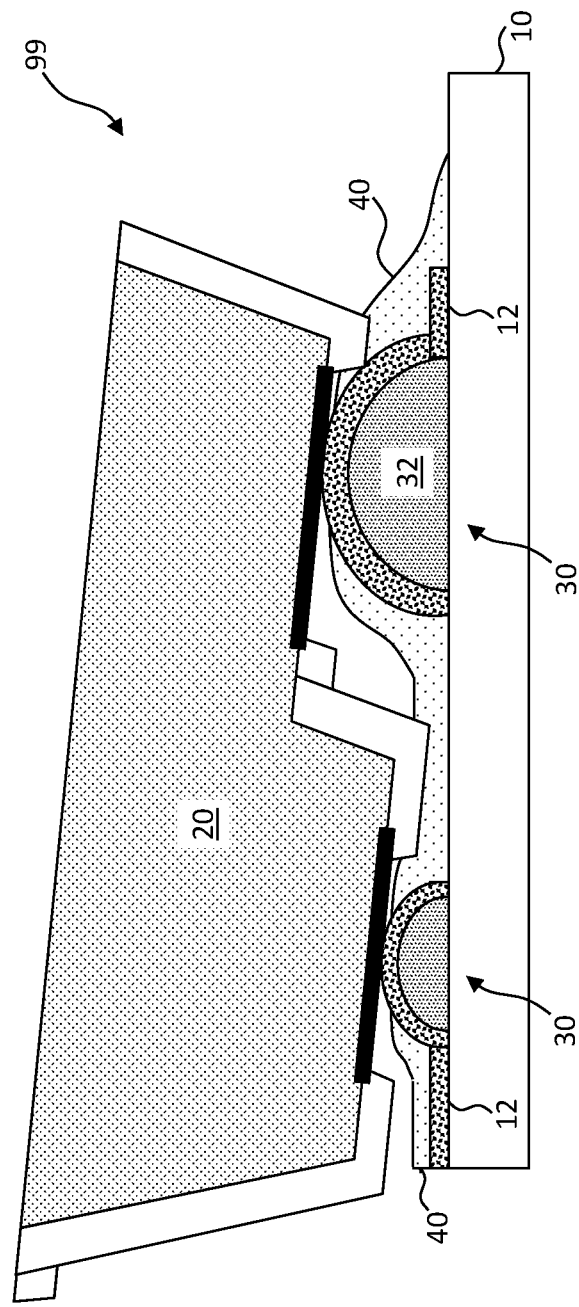

According to some methods of the present disclosure, and as illustrated in the flow diagram of FIG. 8 and successive cross sections of FIGS. 10A-10D, a relatively thick layer of adhesive 40 is disposed over substrate 10 in step 164 that has a depth greater than height 36 of substrate electrical contacts 30, as shown in FIG. 10A. Adhesive 40 is partially cured (e.g., soft cured) in step 166 and patterned in step 168, as shown in FIG. 10B. Devices 20 are transfer printed (e.g., micro-transfer printed with an elastomeric stamp) in step 180 and disposed on adhesive 40 (e.g., float on adhesive 40) as shown in FIG. 10C. In some such embodiments, when adhesive 40 is heated or cured, adhesive 40 reflows and spreads over local portions of substrate 10 in step 192 so that devices 20 are brought into closer proximity to substrate 10 and device electrical contacts 22 are brought into closer proximity and electrical contact with substrate electrical contacts 30, as shown in FIG. 10D. Adhesive 40 is then cured in step 190. The cure step 190 can be done in stages so as to initially reflow polymer core 32 as in step 130 to conform to device electrical contacts 22 and wick contact electrical conductor 34 in step 194 and then finally to hard cure adhesive 40 and polymer core 32.

Adhesive 40 can comprise a layer of resin, polymer, or epoxy, either curable or non-curable and can be disposed, for example by coating or lamination as an unpatterned layer or a patterned layer. In some embodiments, the layer of adhesive 40 is disposed in a pattern, for example using inkjet, screen printing, or photolithographic techniques. In some embodiments, a layer of adhesive 40 is coated, for example with a spray or slot coater, and then patterned, for example using photolithographic techniques.

Figure 11:
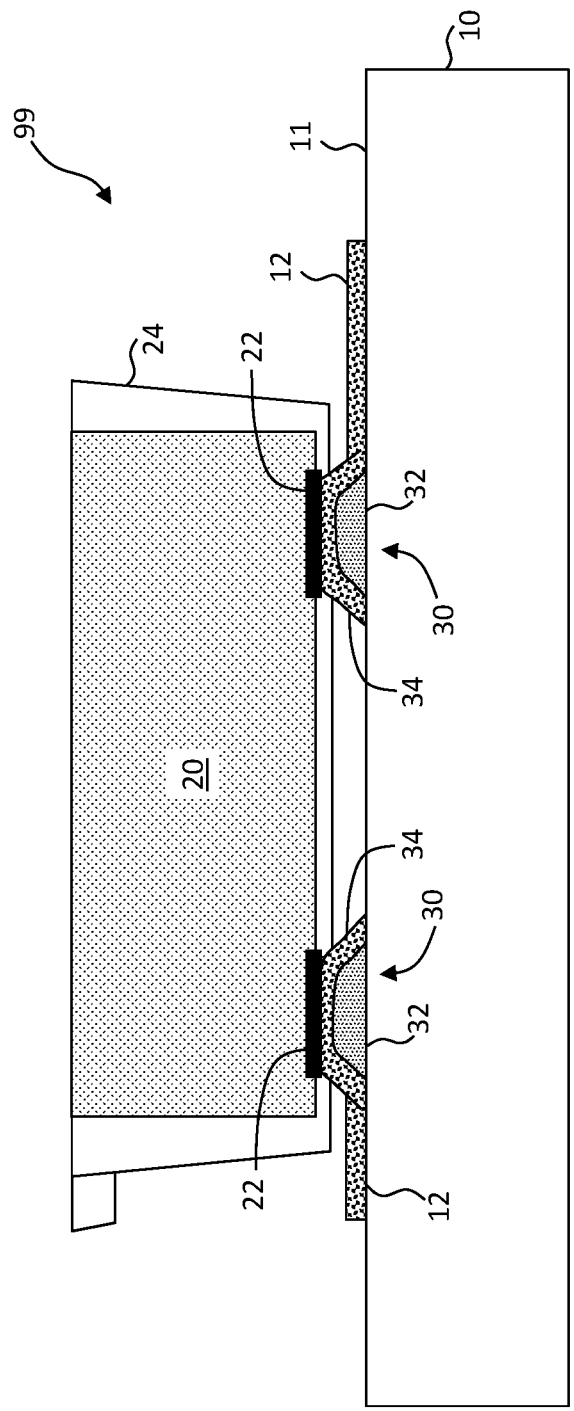
FIG. 11 is a cross section of an LED printed onto a substrate in contact with a conformal rounded contact according to illustrative embodiments of the present disclosure.

According to some embodiments of the present disclosure and as illustrated in FIG. 11, substrate electrical contacts 30 can conform to device electrical contacts 22 after device 20 is transfer printed to substrate 10, for example by heating. For example polymer core 32 can reflow (for example when heated can reflow, soften, and conform to device electrical contact 22 as a consequence of surface tension and relative surface energies, e.g., capillary forces), and then be hard cured (e.g., baked) to permanently set polymer core 32 into a conformal configuration. Contact electrical conductor 34 can also reflow when heated and the material can wick along a surface of device electrical contact 22 and then harden when the printed structure 99 is cooled. According to some embodiments of the present disclosure, polymer 31 layer is soft-baked (heated to a lower temperature), cooled, patterned using photolithography, and then reheated to reflow the patterned polymer 31 to form polymer cores 32. After transfer printing device 20, polymer cores 32 are again heated, together with any adhesive 40, to conform polymer cores 32 to device 20 and device electrical contacts 22 and wick contact electrical conductor 34 along device electrical contacts 22. Printed structure 99 is then cooled for use.

Figure 12:
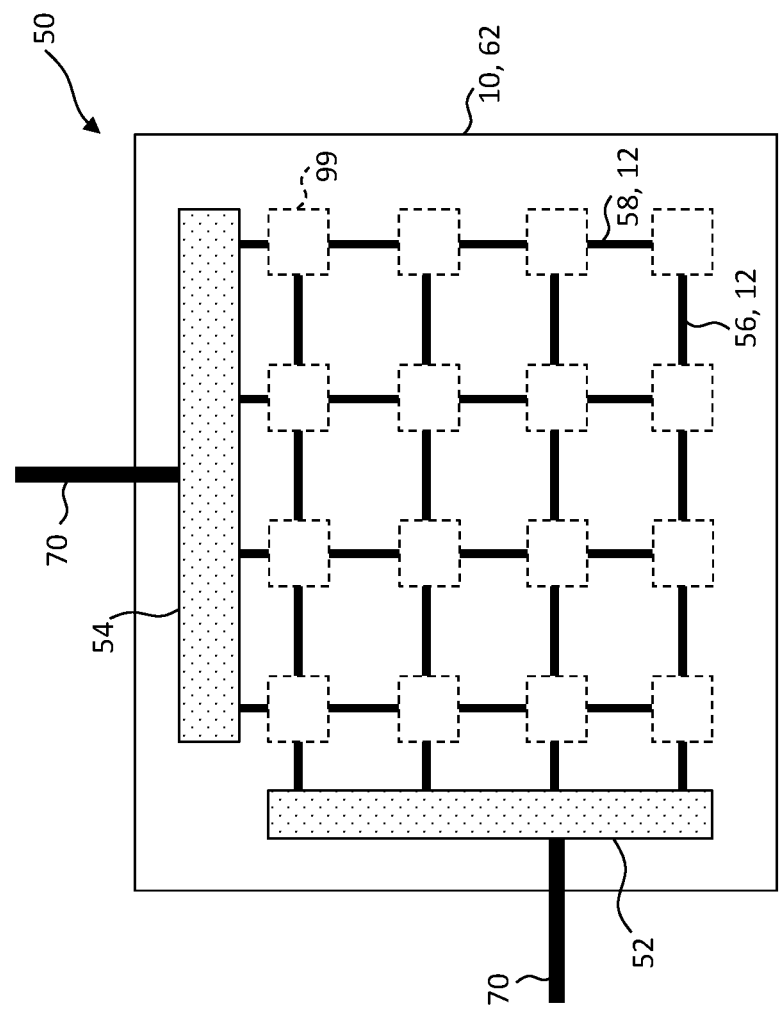
FIG. 12 is plan schematic view of a display comprising printed structures according to illustrative embodiments of the present disclosure.

According to embodiments of the present disclosure, and as illustrated in FIG. 12, pixels 60 in a display 50 can comprise printed structures 99, for example in an active-matrix-controlled array. Substrate 10 of printed structures 99 can be common to all printed structures 99 (e.g., as in FIG. 4) and can be a display substrate 62. Each pixel 60 (and printed structure 99) can be controlled through row wires 56 and column wires 58 (e.g., substrate conductors 12) connected to a row controller 52 and a column controller 54, respectively. Row controller 52 and column controller 54 can be driven through buses 70 from a display controller (not shown).

According to some embodiments of the present disclosure, a printed structure 99 comprises a single device 20 disposed on a substrate 10 (e.g., as shown in FIG. 1-3) or a printed structure 99 comprises multiple devices 20 are disposed on a substrate 10 (e.g., as shown in FIG. 4). In either case, printed structure 99 can itself be a device 20 that can then be disposed as a printed structure on another substrate 10 (e.g., a backplane). Thus, printed structures 99 can be employed multiple times at different levels in microelectronic systems. For example, a printed structure 99 can comprise a device 20 disposed on a substrate 10 that in turn is disposed on another, different substrate 10 to make a larger printed structure 99. Hence, a micro-electronic system according to embodiments of the present disclosure can comprise a printed structure 99 that comprises another printed structure 99 that comprises yet another printed structure 99, at successively smaller scales and with smaller or fewer components. Each printed structure 99 can be or include a device 20 that is comprised in another, larger printed structure 99.

Figure 13:
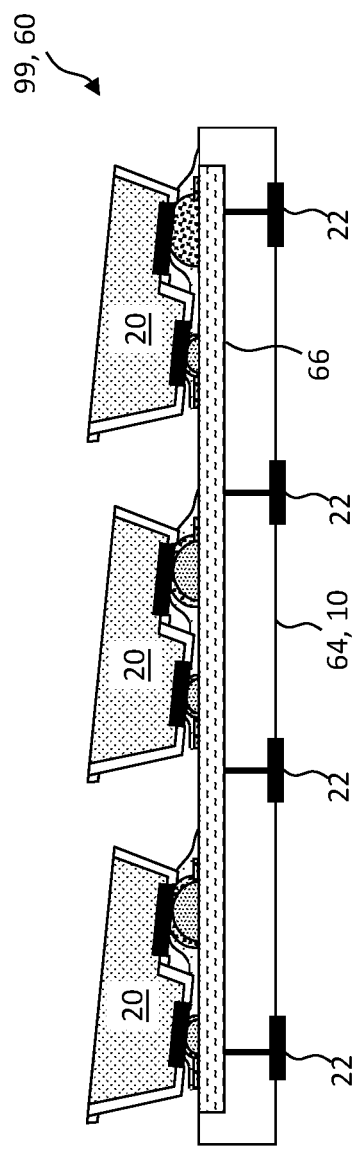
FIG. 13 is a cross section of a pixel with a pixel substrate according to illustrative embodiments of the present disclosure.

As shown in FIG. 13, a printed structure 99 comprises three devices 20 disposed on a common substrate 10. For example, the three devices 20 can be three different micro-LEDs, each emitting a different color of light disposed on a pixel substrate 64. Printed structure 99 can therefore be a pixel 60. In some embodiments, pixel substrate 64 can be a semiconductor substrate (e.g., a silicon substrate) that comprises a pixel control circuit 66 (e.g., a CMOS circuit) that controls LED devices 20. In some embodiments a separate control circuit with a separate substrate (e.g., an integrated circuit) is transfer printed onto pixel substrate 64, 10 (not shown).

Figure 14:
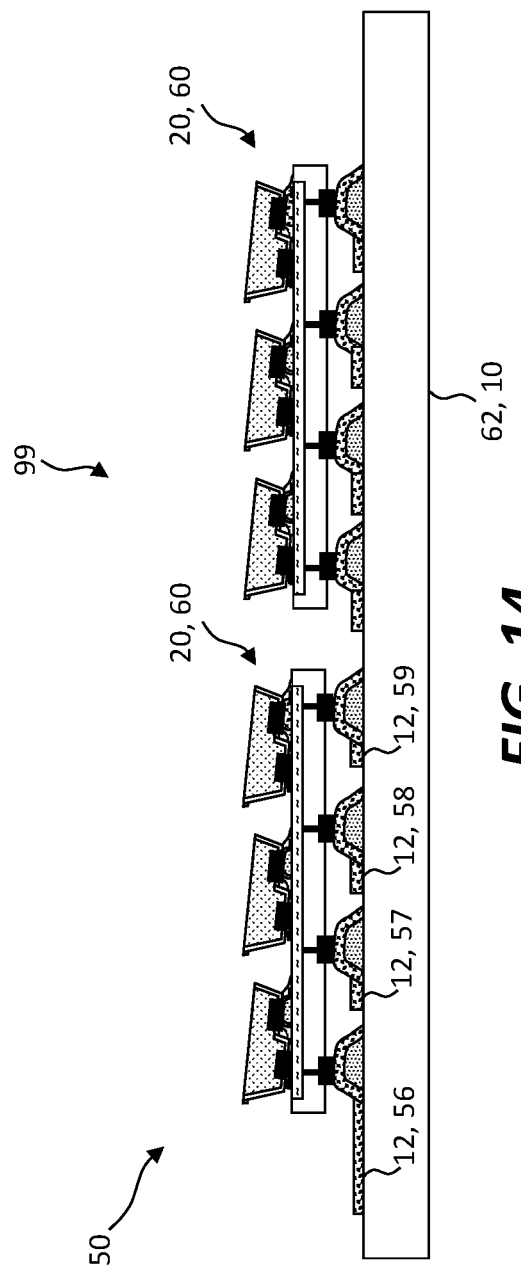
FIG. 14 is a cross section of pixels of FIG. 13 on a display substrate according to illustrative embodiments of the present disclosure.
Figure 15:
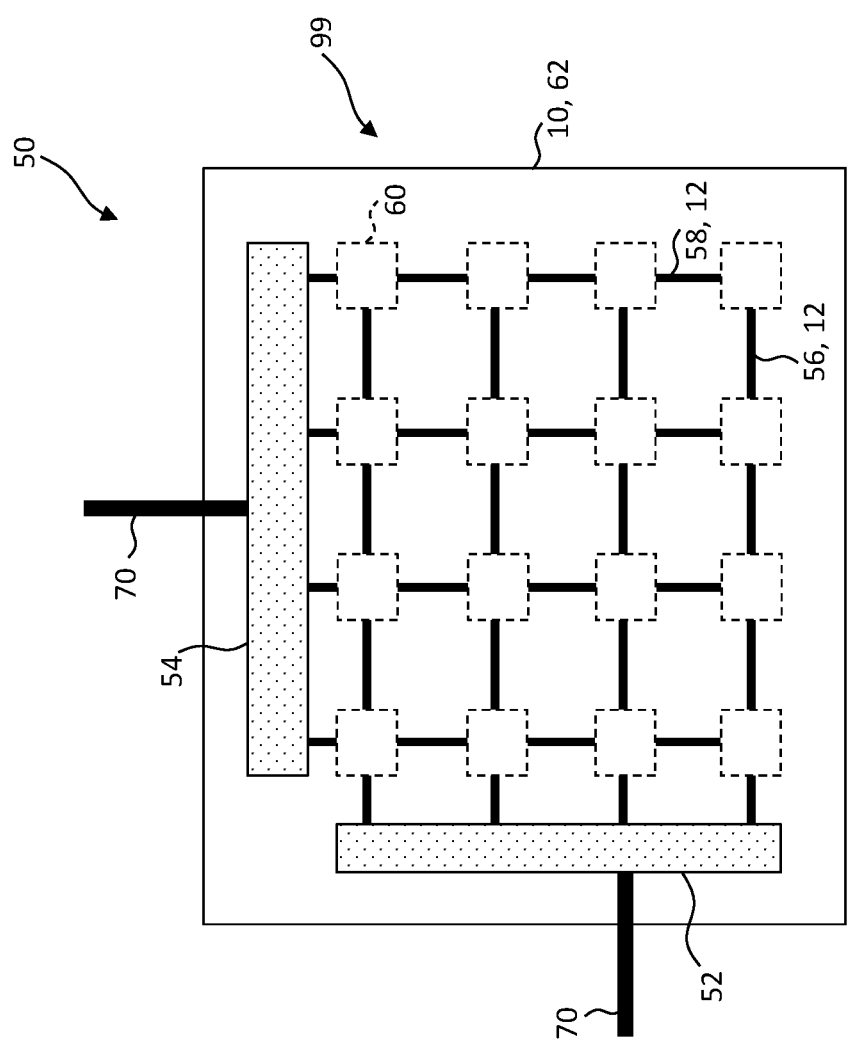
FIG. 15 is a plan view of a display comprising pixels according to illustrative embodiments of the present disclosure.

According to some embodiments of the present disclosure, each of the printed structures 99 of FIG. 13 can be a device 20 that is, in turn, printed onto a substrate 10, for example a display substrate 62 to make a display 50, as shown in FIGS. 14 and 15. FIG. 15 is a plan view of display 50 having pixels 60, each pixel 60 a printed structure 99 as shown in FIG. 13. As shown in FIGS. 13 and 14, each pixel 60 (comprising three devices 20) comprises a pixel substrate 64 and forms a printed structure 99. Four device electrical contacts 22 electrically connect to display substrate 62, 10 to form another, larger printed structure 99. Conductors 12 corresponding to a row wire 56, power wire 57, column wire 58, and ground wire 59, conduct electrical signals to control each pixel 60, as shown in FIG. 15. FIGS. 14 and 15 thus illustrate a display 50 comprising a printed structure 99 having a substrate 10 (display substrate 62) and devices 20 (each a printed structure 99 corresponding to FIG. 13).

Therefore, according to embodiments of the present disclosure, a substrate 10 of a printed structure 99 can be an intermediate substrate 64 (e.g., pixel substrate 64) and printed structure 99 can further comprise a system substrate 62 (e.g., a display substrate 62) comprising substrate conductors 12 disposed on or in system substrate 62. Device 20 can be electrically connected to substrate conductors 12 through contact electrical conductors 34 of substrate electrical contacts 30. An intermediate substrate 64 can be originally formed or disposed on a source wafer (e.g., a pixel source wafer) and then printed to a larger substrate 10, such as a backplane or printed circuit board. For example, a dense array of printed structures 99 can be assembled on an intermediate source substrate and printed to a larger substrate (e.g., a backplane) in an array (e.g., having a lower areal density) to form a display or detector.

Embodiments of the present disclosure provide a mechanically bonded and electrically connected device 20 and substrate 10 at a high resolution that does not rely on solder bumping (e.g., at a lower resolution than printed structures 99) or that is solder free. It can be difficult to form small, micro-sized solder structures (e.g., solder bumps). Typical solder bumps have a size no less than 100 microns and, in recent, advanced solder systems, have a size no less than 30 microns in diameter. In contrast, according to embodiments of the present disclosure, electrical connections on the order of 1-5 microns (or smaller) are readily, efficiently, and effectively constructed with good electrical connection in high-volume processes and electrically connected to devices 20 with lengths and widths in the tens of microns (or smaller or larger). Moreover, forming rounded substrate electrical contacts 30 as disclosed in various embodiments herein can be less expensive (e.g., due to reduced processing steps and/or reduced material costs) than alternative methods of forming robust electrical connections, such as using devices with connection posts (e.g., as disclosed in U.S. Patent Application Ser. No. 14/822,864). For example, due to relatively lower photolithographic resolution requirements and the relative inexpensiveness of compliant, flexible, or reflowable polymers, it can be easier to form rounded polymer shapes coated with electrically conductive material than to form a connection post. In some embodiments, device electrical contacts 22 include connection posts.

Micro-transfer printing processes and structures suitable for disposing devices 20 onto substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-*Based Assembly*, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. Pat. No. 10,153,256, entitled Micro-Transfer Printable Electronic Component, the disclosure of each of which is incorporated herein by reference in its entirety.

For a discussion of micro-transfer printing techniques, see also U.S. Pat. Nos. 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby also incorporated by reference in its entirety. In some embodiments, micro-transfer printed structure 99 is a compound micro-assembled structure (e.g., a macro-system).

Devices 20, in certain embodiments, can be made using integrated circuit photolithographic techniques having a relatively high resolution and cost and substrates 10, for example a printed circuit board, can be made using printed circuit board techniques having a relatively low resolution and cost, thereby reducing manufacturing costs.

In certain embodiments, substrate 10 comprises a member selected from the group consisting of polymer, plastic, resin, polyimide, PEN, PET, metal, metal foil, glass, a semiconductor, a compound semiconductor, and sapphire. In certain embodiments, substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Devices 20, in certain embodiments, can be constructed using foundry fabrication processes used in the art. Layers of materials can be used, including materials such as semiconductors, doped semiconductors, metals, oxides, nitrides and other materials used in the integrated-circuit art. Each device 20 can be or include a complete semiconductor integrated circuit and can include, for example, one or more of a transistor, a diode, a light-emitting diode, and a sensor. Devices 20 can have different sizes, for example, 50 square microns or larger, 100 square microns or larger, 1000 square microns, larger or 10,000 square microns or larger, 100,000 square microns or larger, or 1 square mm or larger. Devices 20 can have variable aspect ratios, for example between 1:1 and 10:1 (e.g., 1:1, 2:1, 5:1, or 10:1). Devices 20 can be rectangular or can have other shapes.

In some embodiments, transferring, printing, or transfer printing occurs by micro-transfer-printing. In some embodiments, micro-transfer printing involves using a transfer device (e.g., an elastomeric stamp, such as a PDMS stamp) to transfer a device 20 using controlled adhesion. For example, an exemplary transfer device can use kinetic or shear-assisted control of adhesion between a transfer device and device 20. It is contemplated that, in certain embodiments, where a method is described as including micro-transfer-printing a device 20, other analogous embodiments exist using a different transfer method. In some examples, transferring a device 20 (e.g., from a source wafer to a substrate 10) can be accomplished using any one or more of a variety of known techniques. For example, in certain embodiments, a pick-and-place method can be used. As another example, in certain embodiments, a flip-chip method can be used (e.g., involving a handle or carrier substrate). In methods according to certain embodiments, a vacuum tool, electrostatic pick-up tool, or other transfer device is used to transfer a device 20.

As is understood by those skilled in the art, the terms "over" and "under" are relative terms and can be interchanged in reference to different orientations of the layers, elements, and substrates included in the present disclosure. Furthermore, a first layer "on" a second layer is a relative orientation of the first layer to the second layer that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

It should be understood that the order of steps or order for performing certain action is immaterial so long as the disclosed technology remains operable. Moreover, two or more steps or actions in some circumstances can be conducted simultaneously.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps. It is contemplated that structures, devices, methods, and processes of the disclosure encompass variations and adaptations developed using information from the embodiments described herein. Adaptation and/or modification of the devices, methods, and processes described herein may be performed by those of ordinary skill in the relevant art.

Certain embodiments of the present disclosure are described above. It is, however, expressly noted that the present disclosure is not limited to those embodiments, but rather the intention is that additions and modifications to what was expressly described in the present disclosure are also included within the scope of the disclosure. Moreover, it is to be understood that the features of the various embodiments described in the present disclosure were not mutually exclusive and can exist in various combinations and permutations, even if such combinations or permutations were not made express, without departing from the spirit and scope of the disclosure. Having described certain implementations of structures and methods for electrically connecting printed horizontal devices, it will now become apparent to one of skill in the art that other implementations incorporating the concepts of the disclosure may be used. Therefore, the disclosure should not be limited to certain implementations, but rather should be limited only by the spirit and scope of the following claims.

PARTS LIST 10 substrate
11 surface
12 substrate conductor/wire
16 planar electrical contact
20 device
22 device electrical contacts
23 common side
24 dielectric structure
25 second side
26 device tether
30 substrate electrical contact
31 polymer
32 contact non-conductive core/contact polymer core
33 electrical conductor coating
34 contact electrical conductor
35 diameter
36 height
38 separation distance
40 adhesive
50 display
52 row controller 54 column controller
56 row wire
57 power wire
58 column wire
59 ground wire
60 pixel
62 display substrate/system substrate
64 pixel substrate/intermediate substrate
P 66 pixel control circuit
70 bus
80 heat
99 printed structure
100 provide substrate step
110 coat substrate with polymer step
120 pattern polymer step
130 reflow patterned polymer step
140 coat substrate with electrical conductor step
150 pattern electrical conductor step
160 coat substrate with adhesive layer step
162 coat substrate with thin adhesive layer step
164 coat substrate with thick adhesive layer step
166 partial cure adhesive layer step
168 pattern adhesive layer step
170 provide device step
180 transfer print device step
190 cure adhesive step
192 reflow adhesive step
194 optional reflow electrical conductor step

What is claimed:

1. A method of making electrical connections comprising:
providing a substrate comprising substrate electrical contacts disposed on a surface of the substrate, wherein at least one of the substrate electrical contacts has a rounded shape forming a bump, wherein (i) the surface of the substrate has a surface energy sufficient to reflow the bump into the rounded shape when the bump has been heated and (ii) the bump comprises a reflowed bead;
providing a device comprising device electrical contacts disposed on a common side of the device;
printing the device to the substrate such that each of the device electrical contacts is in electrical contact with one of the substrate electrical contacts; and
reflowing the rounded shape,
wherein each of the at least one of the substrate electrical contacts has a lateral extent over the substrate of no more than 10 μm and the device comprises a fractured or separated device tether.

2. The method of claim 1, comprising disposing adhesive on the substrate prior to printing the device, wherein printing the device comprises contacting the device to the adhesive.

3. The method of claim 2, comprising curing the adhesive after the device has been printed.

4. The method of claim 1, comprising baking the device and the substrate.

5. The method of claim 1, comprising conforming the substrate electrical contact to the device electrical contact.

6. The method of claim 1, wherein the at least one of the substrate electrical contacts comprises a polymer core disposed on the surface of the substrate, the polymer core is coated with a contact electrical conductor on a surface of the polymer core, and the polymer core is the reflowed bead.

7. The method of claim 1, wherein the device electrical contacts are substantially planar and are disposed in a common plane.

8. The method of claim 1, wherein the device electrical contacts are substantially planar and are disposed in different planes.

9. The method of claim 1, wherein the device is tilted with respect to the substrate.

10. The method of claim 1, comprising an adhesive disposed between the device and the substrate that adheres the device to the substrate.

11. The method of claim 1, wherein the at least one of the substrate electrical contacts is a plurality of the substrate electrical contacts and the plurality comprises ones of the substrate electrical contacts having different heights or sizes.

12. The method of claim 1, wherein the device is an unpackaged bare die.

13. A method of making electrical connections comprising:
providing a substrate comprising substrate electrical contacts disposed on a surface of the substrate, wherein at least one of the substrate electrical contacts has a rounded shape;
providing a device comprising device electrical contacts disposed on a common side of the device; and
printing the device to the substrate such that each of the device electrical contacts is in electrical contact with one of the substrate electrical contacts,
wherein providing the substrate comprising substrate electrical contacts disposed on a surface of the substrate comprises:
providing a substrate;
patterning a polymer on the substrate;
heating the patterned polymer to form one or more rounded shapes of the polymer; and
coating the one or more rounded shapes with a conductive material, wherein each of the at least one of the substrate electrical contacts comprises one of the one or more rounded shapes coated with the conductive material to form a conductive surface layer that is a contact electrical conductor,
wherein at least one of the substrate electrical contacts comprises an electrically conductive polymer.

14. The method of claim 13, wherein coating the one or more rounded shapes with the conductive material comprises:
depositing a layer of the conductive material; and
patterning the layer such that the one or more rounded shapes remain coated with the conductive material.

15. The method of claim 13, wherein at least one of the substrate electrical contacts is compliant, conformal, or flexible.

16. The method of claim 13, wherein the substrate electrical contacts are reflowable.

17. The method of claim 13, wherein the substrate electrical contacts have been wicked along the device electrical contact.

* * * * *